United States Patent
Oh et al.

(10) Patent No.: US 8,021,805 B2
(45) Date of Patent: Sep. 20, 2011

(54) BACKSIDE PHASE GRATING MASK AND METHOD FOR MANUFACTURING THE SAME

(75) Inventors: Sung Hyun Oh, Cheongju-si (KR); Byung Ho Nam, Daegu (KR)

(73) Assignee: Hynix Semiconductor Inc., Icheon-si (KR)

( * ) Notice: Subject to any disclaimer, the term of this patent is extended or adjusted under 35 U.S.C. 154(b) by 152 days.

(21) Appl. No.: 12/493,075

(22) Filed: Jun. 26, 2009

(65) Prior Publication Data
US 2010/0167182 A1    Jul. 1, 2010

(30) Foreign Application Priority Data
Dec. 26, 2008   (KR) .................. 10-2008-0134826

(51) Int. Cl.
*G03F 1/00* (2006.01)
*G03C 5/00* (2006.01)
(52) U.S. Cl. .......................... 430/5; 430/394
(58) Field of Classification Search ............ 430/5, 311, 430/312, 313, 394; 438/201, 211
See application file for complete search history.

(56) References Cited

U.S. PATENT DOCUMENTS

| | | | | |
|---|---|---|---|---|
| 5,851,701 A | * | 12/1998 | Rolson | 430/5 |
| 6,249,335 B1 | * | 6/2001 | Hirukawa et al. | 355/53 |
| 6,335,129 B1 | | 1/2002 | Asano et al. | |
| 6,541,326 B2 | * | 4/2003 | Fujiwara | 438/211 |
| 6,866,968 B2 | * | 3/2005 | Shin et al. | 430/5 |

FOREIGN PATENT DOCUMENTS
KR   1020030067039 A   8/2003
KR   1020070068895 A   7/2007
* cited by examiner

*Primary Examiner* — Stephen Rosasco
(74) *Attorney, Agent, or Firm* — Kilpatrick Townsend & Stockton LLP

(57) ABSTRACT

A mask includes mask patterns formed over a frontside of a substrate and a phase grating formed over a backside of the substrate. The mask patterns correspond to a layout of diagonal patterns extending in a direction rotated toward a predetermined direction from an axis of a rectangular coordinate system. The phase grating extends in a direction parallel to the extending direction of the mask patterns. The phase grating includes first and second phase regions alternately arranged over the backside of the substrate with a phase difference of 180° therebetween. The first and second phase regions induce a phase interference that blocks a zero-order light of an exposure light incident to the substrate and allows a primary light to be incident to the mask patterns.

14 Claims, 7 Drawing Sheets

BACKSIDE PHASE GRATING MASK AND METHOD FOR MANUFACTURING THE SAME

CROSS-REFERENCE TO RELATED APPLICATIONS

The present application claims priority to Korean patent application number 10-2008-0134826, filed on Dec. 26, 2008, which is incorporated by reference in its entirety.

BACKGROUND OF THE INVENTION

The present invention relates to a photolithography, and more particularly, to a backside phase grating mask and a method for manufacturing the same.

As a method of increasing an integration degree of a semiconductor device, there has been suggested a method of converting a cell structure of a semiconductor device, such as a Dynamic Random Access Memory (DRAM) device, from $8F^2$ cell layout into $6F^2$ cell layout. In the $6F^2$ cell layout, an active region extends in a direction diagonal with respect to a word line and a bit line, which are perpendicular to each other, thereby allowing arrangement of more transistors within a limited area. A pattern delimiting the active region is a diagonal pattern which is rotated by a predetermined angle with respect to the word line or the bit line.

The diagonal pattern is introduced, unlike the word line or the bit line, not in the form of a rectangular coordinate system but in the form extending in a direction rotated by a predetermined angle on the rectangular coordinate system. Thus, a modified illuminating system which is adapted to the rectangular coordinate system cannot be effective on the diagonal pattern. The modified illuminating system such as a dipole illuminating system, though introduced to improve a resolution limitation of an exposure light source, can obtain a desirable effect when a transferred pattern is a line and space pattern which extends in an X-axis direction or a Y-axis direction of an XY rectangular coordinate system.

The modified illuminating system, such as an X-axis dipole having a pair of dipoles arranged in an X-axis, improves the resolution of line and space patterns extending in a Y-axis direction. However, when the X-axis dipole illuminating system is employed in an exposure process of pattern-transferring diagonal patterns rotated by a predetermined angle with respect to a Y-axis, a position angle of the dipole and a position angle of an edge of the diagonal patterns are deviated from each other. Thus, the effect of improving resolution by dipole illumination can be reduced by half. Moreover, a pattern defect results because the diagonal patterns cannot be pattern-transferred in the form extending along a designed direction, but its extending direction is deviatedly moved toward the Y-axis direction by the dipole illumination. That is to say, the diagonal pattern transferred onto a wafer can be transferred not with a designed rotation angle with respect to the Y-axis but with a smaller angle.

Therefore, it is required to develop an improved illuminating system.

SUMMARY OF THE INVENTION

Embodiments of the present invention are directed to a mask capable of pattern-transferring a diagonal pattern extending in a direction rotated by a predetermined angle with respect to an axis direction of a rectangular coordinate system, and a method for manufacturing the same.

In one embodiment, a mask includes a substrate; mask patterns formed over a frontside of the substrate, the mask patterns corresponding to a layout of diagonal patterns extending in a direction rotated toward a predetermined direction from an axis of a rectangular coordinate system; and a phase grating with a linear shape formed over a backside of the substrate, the phase grating extending in a direction parallel to the extending direction of the mask patterns.

Preferably, the diagonal patterns correspond to a layout of active regions in a $6F^2$ cell arrangement.

Preferably, the phase grating includes first and second phase regions, which are alternately arranged over the backside of the substrate with a phase difference of 180° therebetween so as to induce a phase interference that blocks a zero-order light of an exposure light incident to the substrate and allows a primary light to be incident to the mask patterns.

Preferably, the first phase region includes a trench having a depth providing the phase difference of 180° to a surface of the backside of the substrate, and the second phase region is a surface region of the backside of the substrate which is delimited by the trench.

Preferably, a grating pitch including widths of the first phase region and the second phase region is approximately two times a pattern pitch including a width of each mask pattern and a width of a spacing of adjacent mask patterns.

Preferably, the phase grating is arranged in a region broadened by 800 to 1000 μm relative to an outside of a region in which the mask patterns are arranged.

In another embodiment, a mask includes a substrate; a first region having first mask patterns formed over a frontside of the substrate, the first mask patterns corresponding to a layout of diagonal patterns extending in a direction rotated toward a predetermined direction from an axis of a rectangular coordinate system; a second region having second mask patterns extending in an axial direction of the rectangular coordinate system; and a phase grating with a linear shape selectively formed over a backside region of the substrate, wherein the phase grating region corresponds to the first region and extends in a direction parallel to the extending direction of the first mask patterns.

In a further embodiment, a method for manufacturing a mask includes forming mask patterns over a frontside of a substrate, the mask patterns corresponding to a layout of diagonal patterns extending in a direction rotated toward a predetermined direction from an axis of a rectangular coordinate system; and forming a phase grating with a linear shape over a backside of the substrate, the phase grating extending in a direction parallel to the extending direction of the mask patterns.

Preferably, the forming of the phase grating includes forming a photoresist pattern over the backside of the substrate; and forming a trench having a depth providing a phase difference of 180° to a surface of the backside of the substrate by performing a selective etch to the backside of the substrate exposed by the photoresist pattern.

Preferably, the forming of the photoresist pattern includes forming an Anti Reflective Coating (ARC) over the backside of the substrate; coating a photoresist layer over the ARC; making a mother mask having a pattern layout of the phase grating; and selectively exposing and developing some of the photoresist layer using the mother mask.

According to the present invention, a backside of a mask provided is provided with phase grating patterns which provide a modified illumination adapted to a mask pattern formed over a frontside of the mask, and a method for manufacturing such a mask.

DESCRIPTION OF SPECIFIC EMBODIMENTS

Embodiments of the present invention provides, for pattern-transferring a diagonal pattern extending in a direction rotated by a predetermined angle to an axial direction of an XY rectangular coordinate system in a $6F^2$ cell arrangement structure, a mask provided with a plurality of mask patterns formed over a frontside of the mask and a plurality of phase grating patterns formed over a backside of the mask. The phase grating patterns cause a phase shift and extend in a direction parallel to an extending direction of the diagonal pattern.

The phase grating pattern can cause a light incident to the mask during an exposure process to be off axis incident over an off axis incidence limitation of an exposure apparatus, and induce an outermost region of an aperture to be used in the exposure. The phase grating pattern is formed extending in a direction parallel to the extending direction of the mask pattern to realize a modified illumination of a suitable form, such as a dipole illumination, depending on the layout of the mask pattern formed as a light shielding pattern over a frontside of the mask.

The phase grating pattern induces an effect that an axis of a pole of the dipole is arranged in a direction perpendicular to the direction along which the mask pattern extends, and thus can induce an effect that a primary light (or a negative primary light) is incident to an edge of the mask pattern. Therefore, a resolution improvement effect equal to that of the axis of the pole of the dipole that is arranged in a X-axis perpendicular to line and space patterns extending in the Y-axis in a rectangular coordinate system can be effectively realized with respect to the diagonal pattern, thereby improving a process margin of an exposure process. Therefore, it is possible to accurately pattern-transfer the diagonal pattern even in the exposure process in which a separate modified illumination is not introduced but a conventional illumination is introduced. Consequently, it is possible to reduce the time and cost to develop the separate modified illumination system adapted to the diagonal pattern, and to thus increase productivity of the semiconductor device manufacturing process.

Figure 1:
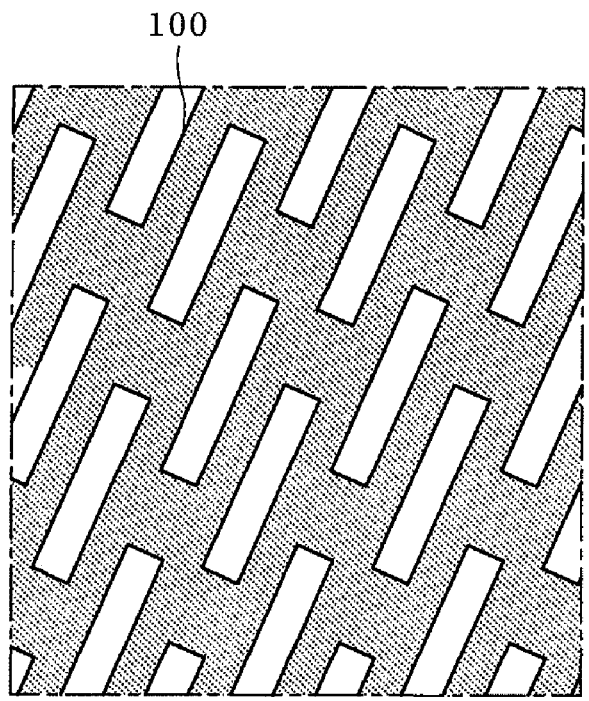
FIG. 1 illustrates a layout of a diagonal pattern in $6F^2$ cell arrangement in accordance with an embodiment of the present invention.

Referring to FIG. 1, a layout of a diagonal pattern 100 that exposes an active region in a $6F^2$ cell arrangement of a DRAM device is designed as a linear pattern or a rectangular pattern that extends in a diagonal direction rotated by a predetermined angle with respect to a word line and a bit line that are perpendicular to each other. Since the word line and the bit line are parallel to an axial direction of the XY rectangular coordinate system, the diagonal pattern 100 extends in a direction inclined by a predetermined angle with respect to an X-axis or a Y-axis. When pattern-transferring the diagonal pattern 100 using an exposure apparatus, an effect of improving a resolution by a primary light is reduced by half in a modified illuminating system such as a dipole illuminating system. This results because the modified illuminating system is provided with a pair of poles arranged in the Y-axial direction (or the X-axial direction) but an edge of the diagonal pattern 100 does not extend in the X-axial direction (or the Y-axial direction) which is perpendicular to the direction of the pair of the poles.

Figure 2:
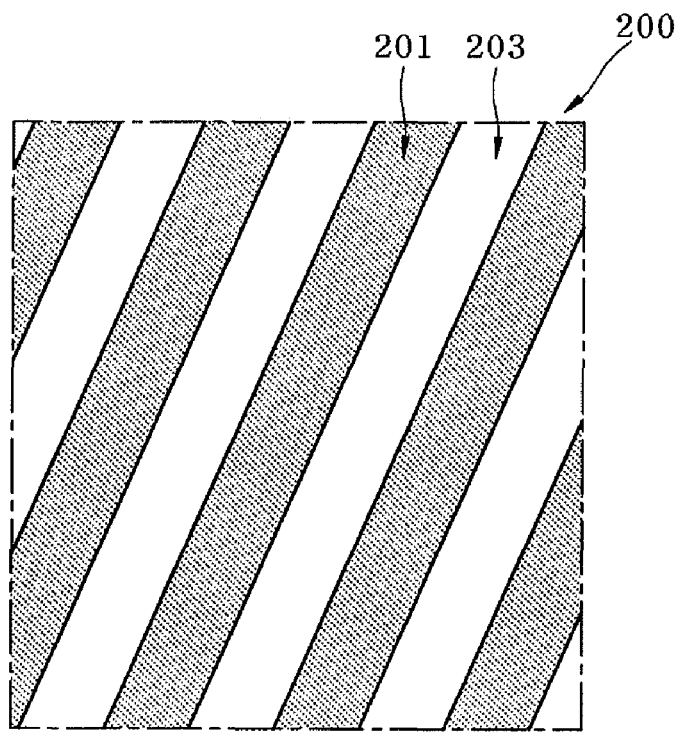
FIG. 2 illustrates a phase grating layout in accordance with an embodiment of the present invention.

In order to improve the resolution of the modified illuminating system, a phase grating 200 in a linear shape which extends in a diagonal direction is designed as illustrated in FIG. 2. The phase grating 200 is set so that a first phase region 201 and a second phase region 203 are alternately arranged. The first and second phase regions 201, 203 are set in a linear shape which extends in the same direction as the diagonal pattern 100. Also, the first and second phase regions are set to a 0° phase region or a 180° phase region with a phase difference of 180°, so that light passing through the first and second phase regions 201, 203 generates a mutual phase interference to block a zero-order light and allow a primary light or a negative primary light to pass therethrough.

Figure 3:
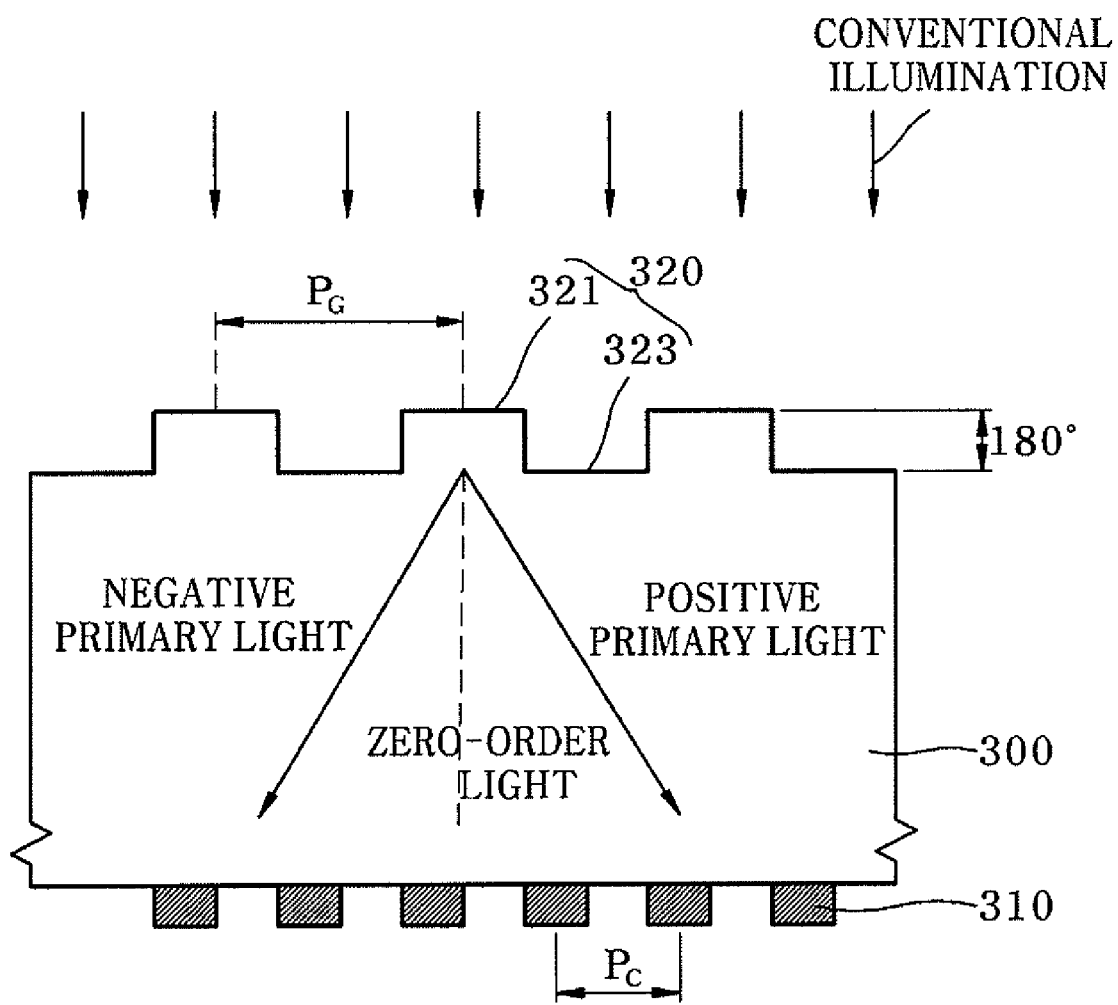
FIG. 3 illustrates a structure of a mask in accordance with an embodiment of the present invention.

A layout of the diagonal pattern 100 of FIG. 1 and a layout of the phase grating 200 of FIG. 2 are respectively provided onto a frontside and a backside of a transparent substrate 300 such as quartz, as illustrated in FIG. 3. A mask pattern 310 is formed on the frontside of the substrate 300 in a light shielding pattern of chromium (Cr) or a phase shifter pattern of molybdenum (Mo) alloy. The mask pattern 310 is formed corresponding to the layout of the diagonal pattern 100 of FIG. 1. A first phase region 321 is provided on the backside of the substrate 300 and a phase grating pattern 320 including a second phase region 323 provided as a trench which sets the first phase region 321 is formed corresponding to the layout of the phase grating 200 of FIG. 2.

A grating pitch $P_G$ including widths of the first and second phase regions 321, 323 is two times the pattern pitch $P_C$ including a width of the mask pattern 310 and a width of the spacing of adjacent mask patterns 310. Though this pitch multiple can be varied in consideration of a thickness of the substrate 300, it is effective to set the pitch multiple to two times when considering a contrast of an image resulting from the exposure. The first phase region 321 and the second phase region 323 forming a phase grating pattern 320 are formed to have a phase difference of 180° for the phase interference. Thus, the second phase region 323 formed as a trench is formed to a depth which induces the phase difference of 180° to the surface.

This mask can provide a modified illumination to the mask pattern 310 by the phase grating pattern 320 provided on the backside thereof. When an exposure light incident to the phase grating pattern 320 is a conventional illumination, the light incident by the phase grating pattern 320 generates a phase interference and, thus, the zero-order light is blocked by the interference and the positive primary light or the negative primary light passes through to the inside of the substrate 300. Therefore, the mask pattern 310 is subject to an effect in that the primary light (or the negative primary light) is substantially incident thereto. This effect is substantially the same effect as an Off Axis Illumination (OAI) in which a modified illuminating system is introduced.

With the exposure process using the mask in accordance with an embodiment of the present invention, it is possible to obtain an effect of improving a pattern-transfer resolution by a modified illumination although a separate modified illumination system is not introduced and a conventional illumination alone is employed. Accordingly, since it is possible to omit a process of developing a modified illumination system with a separate aperture adapted to the diagonal pattern (100 of FIG. 1) and mounting it to the exposure equipment, it is possible to pattern-transfer various forms of diagonal patterns 100 more accurately onto the wafer.

Figure 4A:
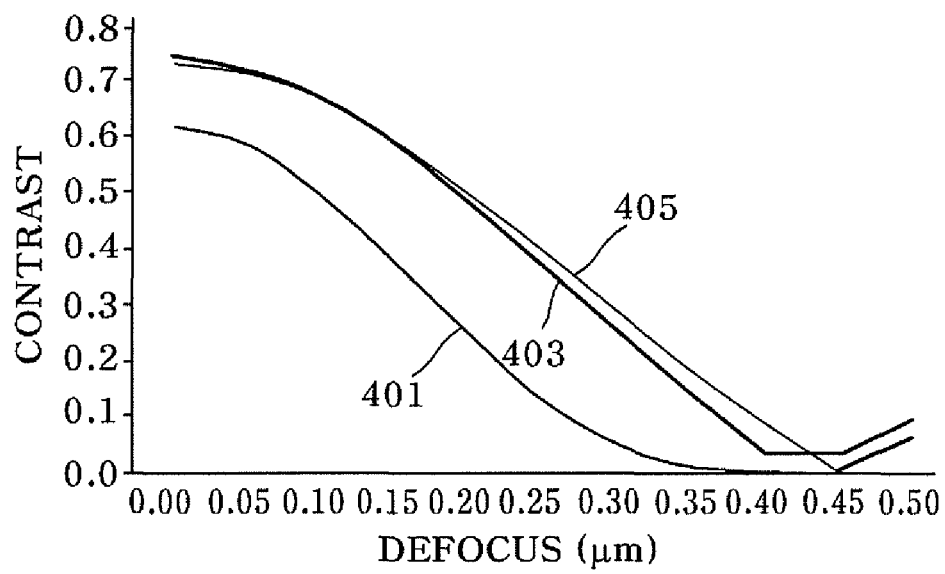
FIGS. 4A and 4B illustrate a result of a simulation to illustrate an effect of resolution improvement of the mask in accordance with an embodiment of the present invention.

Referring to FIG. 4A, results of exposure simulation on the line and space pattern with various modified illumination systems shows that the introduction of the phase grating pattern 320, in accordance with an embodiment of the present invention, can give an effect similar to the effect of introduction of the dipole illumination system. The first result 401 of the exposure simulation, where a circular illumination system having a circular light transmitting part located at a position 0.8 times of a radius of a lens is used, shows a sharp decrease in a contrast ratio with an increase in a defocus. In comparison, the second result 403 of the exposure simulation where the phase grating pattern 320 is introduced and a conventional illumination system is used, and a third result 405 of the exposure simulation where a pair of light transmitting parts is provided in a form of a pole at a position from 0.6 times to 0.8 times of a radius of a lens, have similar shapes and show higher contrast ratios than that of the first result 401.

Figure 4B:
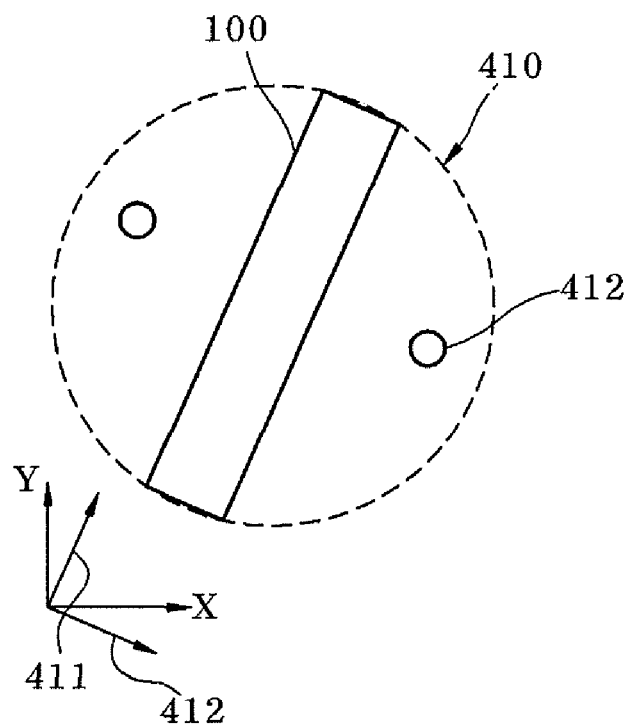

These simulation results show, as illustrated in FIG. 4B, that, when the diagonal pattern 100 extends not in an axial direction of an XY rectangular coordinate system but in a diagonal direction 411, the mask in accordance with an embodiment of the present invention can effectively provide the same effect as the introduction of a diagonal dipole illumination system 410 in which a pole 412 is arranged in a direction 412 perpendicular to an edge of the diagonal pattern 100.

Figure 5:
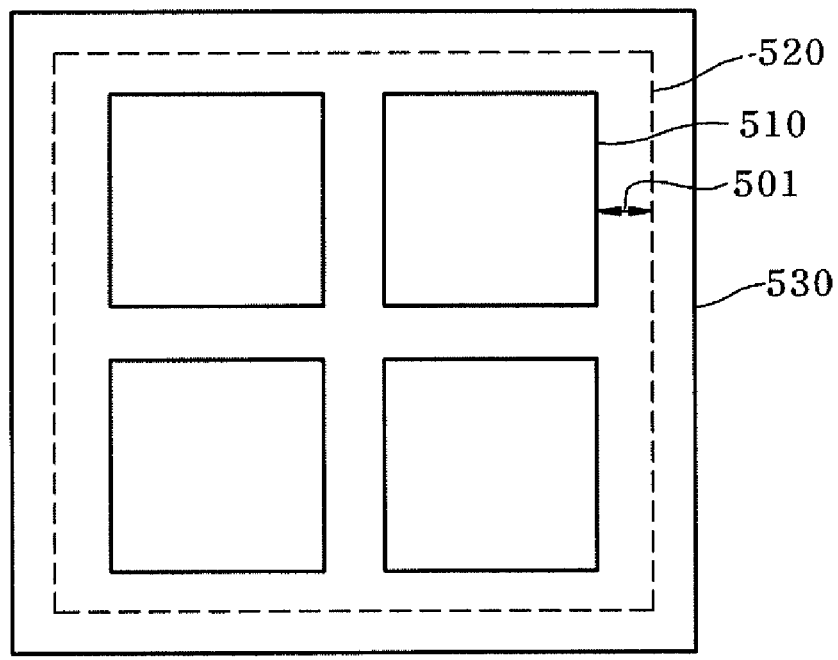
FIGS. 5 and 6 illustrate a first modification of the structure of the mask in accordance with an embodiment of the present invention.
Figure 6:
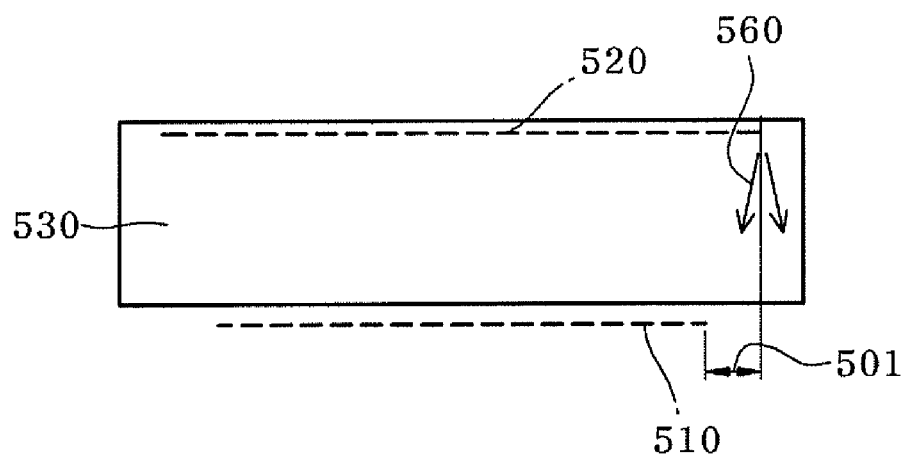

The mask illustrated in FIG. 3 can be provided as a mask 530 with a rectangular plate shape as illustrated in FIG. 5. Referring together to FIGS. 5 and 6, a chip region in which the mask patterns (310 of FIG. 3) are arranged or a grating region 520 in which the phase grating patterns (320 of FIG. 3) are arranged is set to be wider than the mask region 510 and is extended outside of the mask region 510. When a stray light 560 entering from outside of the mask region 510 to the inside thereof includes a zero-order light, the effect of improving the pattern resolution by the primary light provided from the phase grating region 520 can be reduced by half. That is to say, the pattern-transfer resolution of the mask pattern 310 in a boundary of the mask region 510 can be deteriorated by the stray light 560. By arranging the phase grating region 520 in a wider region than the mask region 510, a partial reduction in the resolution by the stray light is avoided. The grating region 520 is arranged to have a width broadened by 800 to 1000 μm relative to the mask region 510 in consideration of a position where the stray light capable of approaching the outside of the mask region 510 is generated and the thickness of the mask 530.

Figure 7:
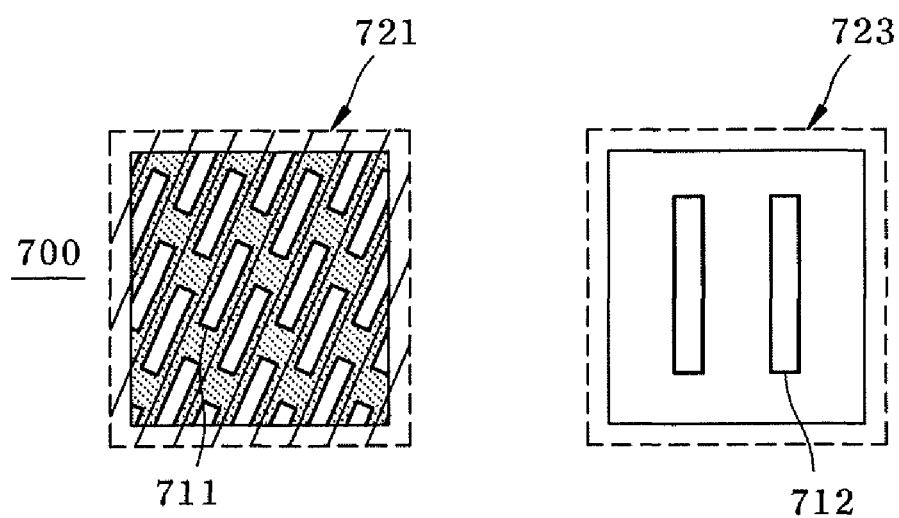
FIG. 7 illustrates a second modification of the structure of the mask in accordance with an embodiment of the present invention.

The phase grating pattern (320 of FIG. 3) in accordance with an embodiment of the present invention can be selectively arranged in the region in which the mask pattern 310 following the diagonal pattern (200 of FIG. 2) is positioned. Referring to FIG. 7, the first region 721 including the first mask pattern 711 which corresponds to the diagonal pattern 200 and the second region 723 with the second mask pattern 712 of a vertical pattern extending in an axial direction of the rectangular coordinate system can be provided in one mask 700. The phase grating pattern 721 is selectively arranged in the first region 721. Therefore, the resolution improvement by the modified illumination is induced to the first mask pattern 711 corresponding to the diagonal pattern 200. However, the modified illumination effect by the phase grating pattern 721 is excluded in the second region 723 with the second mask pattern 712 in which this effect by the modified illumination can reduce the resolution by half or cause pattern movement. The second mask pattern 712 may include, besides the vertical pattern, a horizontal pattern or a hole pattern.

Figure 8:
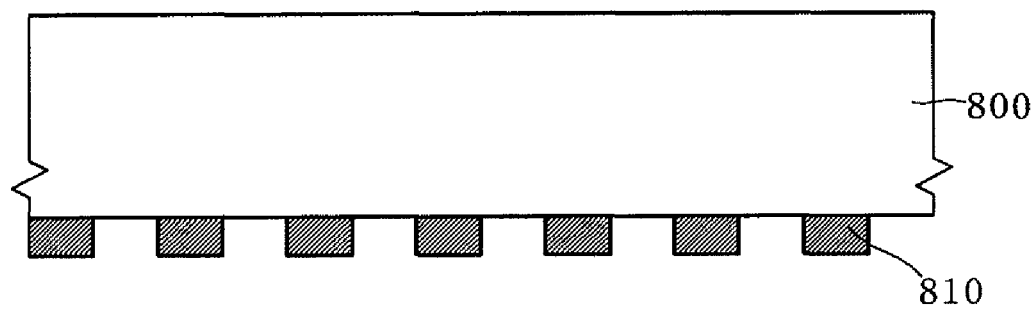
FIGS. 8 through 12 illustrate process steps of manufacturing the mask in accordance with an embodiment of the present invention.

To manufacture the mask of FIG. 3 in accordance with an embodiment of the present invention, a mask pattern 810 is formed over a frontside of a substrate 800, as illustrated in FIG. 8. The mask pattern 810 is formed including mask layer deposition, electron beam lithography and selective etching processes to correspond to the layout of the diagonal pattern 100 of FIG. 1.

Figure 9:
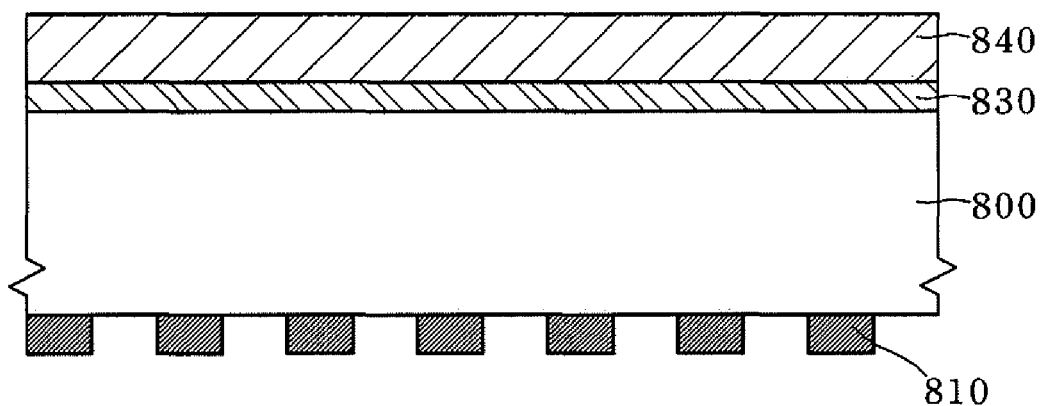

Referring to FIG. 9, a bottom Anti Reflective Coating (ARC) is formed on a backside of the substrate 810 formed with the mask pattern 810. The ARC 830 is a soluble bottom ARC which can be developed and removed together with the development of a photoresist layer 840.

With the introduction of the ARC 830, an interfacial property with the photoresist layer to be subsequently coated is improved and an adhesion can thus be enhanced. When the photoresist layer 840 is directly coated on the surface of the quartz substrate 800, a defect such as partial separation of the photoresist layer 840 can be caused since an interfacial adhesion between the quartz and the photoresist is poor. The ARC 830 can improve this interfacial defect. Also, it is possible to realize improvement of the pattern resolution according to inhibition of diffused reflection upon exposure of the photoresist layer 840.

Figure 10:
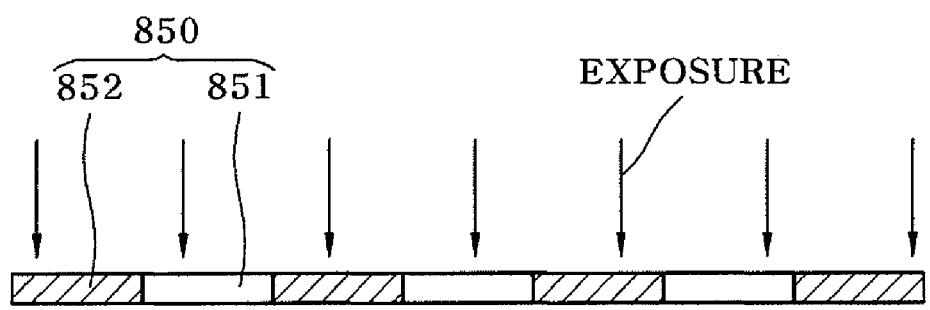
Figure 10:
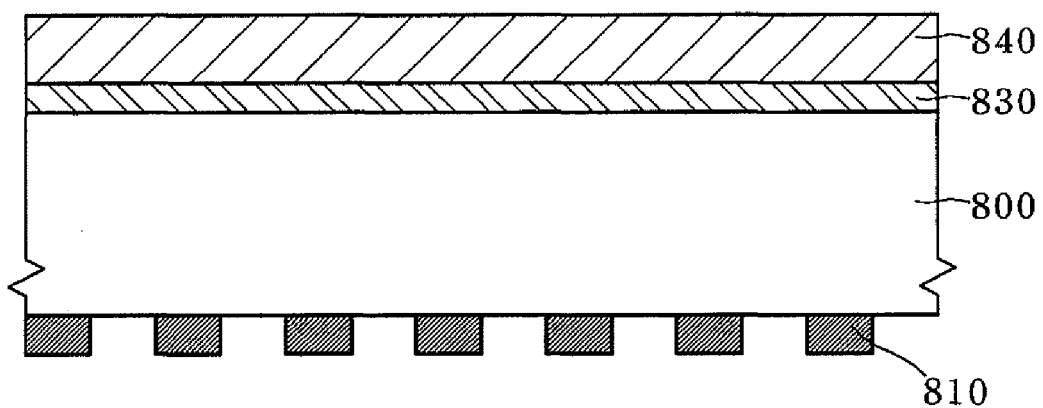

Referring to FIG. 10, a process of exposing the photoresist layer 840 is performed. An electron beam exposure process using the layout of the phase grating (200 of FIG. 2) can be performed on the photoresist layer, However, it can take much time and cost to perform the electron beam exposure process when manufacturing each mask. Therefore, the process of exposing the photoresist layer 840 can be performed as an optical exposure process for introducing a mother mask 850 in which the phase grating pattern (320 of FIG. 3) is provided to a light transmitting region 851 and a light shielding region 852. After the mother mask 850 is manufactured in a mask manufacturing process, the exposure process is performed with the mother mask 850 being mounted in a stepper or an exposure apparatus. This optical exposure process can reduce the time and cost required to manufacture the mask.

Figure 11:
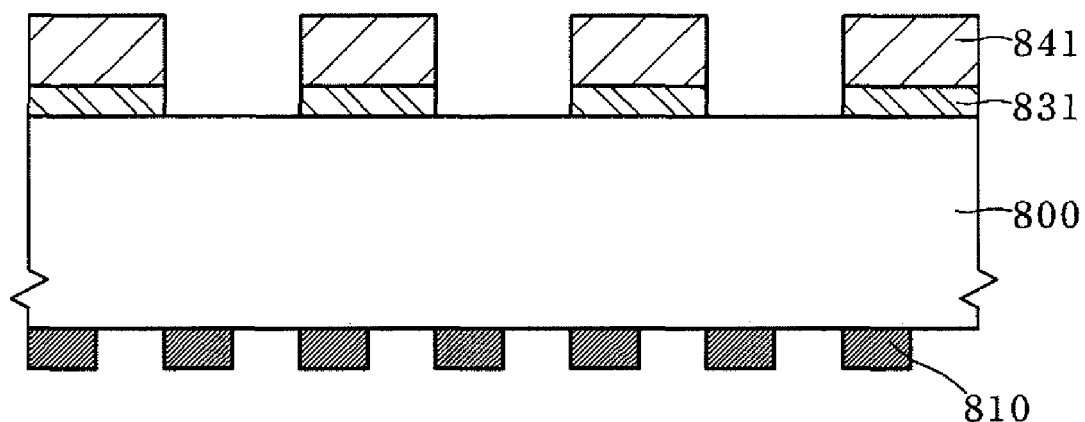

Referring to FIG. 11, the exposed photoresist layer (840 of FIG. 10) is developed to form a photoresist pattern 841. The portion of the ARC (830 of FIG. 10) exposed by the development of the photoresist pattern 841 can be dissolved and removed by a developing solution since the ARC is a soluble bottom ARC. Therefore, the development and patterning of the ARC pattern 831 can be performed together with the development of the photoresist pattern 841.

Figure 12:
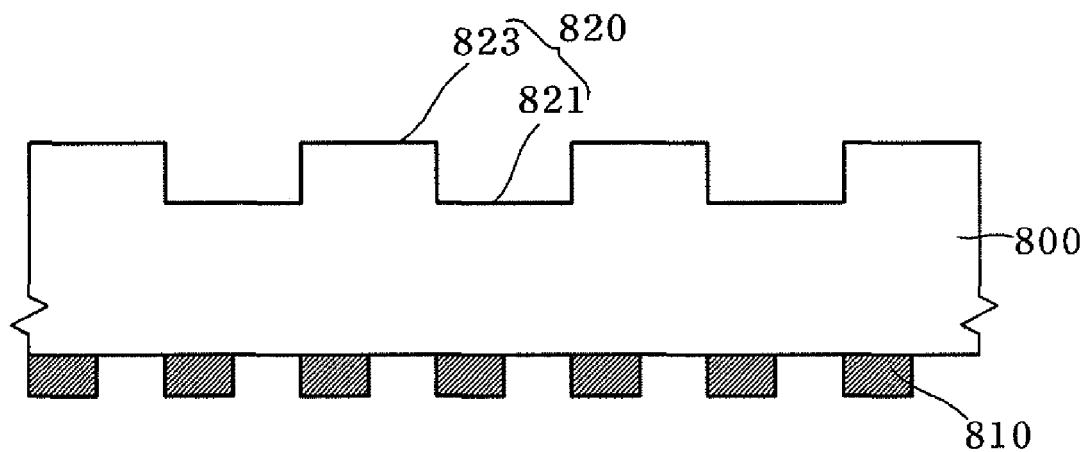

Referring to FIG. 12, a backside portion of the substrate 800 exposed by the photoresist pattern 841 is selectively etched to form a trench 821. The trench 821 can be used as the second phase region (203 of FIG. 2), and the surface region 823 of the backside of the substrate 800 delimited by the trench 821 can be used as the first phase region (201 of FIG. 2).

As is apparent from the above description, the mask in accordance with an embodiment of the present invention is provided with the phase grating pattern (320 of FIG. 3) which provides a modified illumination in the mask, thereby providing a modified illumination such as a dipole illumination to the mask pattern (310 of FIG. 3) of a diagonal pattern. Therefore, it is possible to exclude the process of developing an aperture for a separate modified illumination and increase productivity in the photolithography process.

While the present invention has been described with respect to the specific embodiments, it will be apparent to those skilled in the art that various changes and modifications may be made without departing from the spirit and scope of the invention as defined in the following claims.

What is claimed is:

1. A mask, comprising:
   a substrate;
   diagonal patterns as mask patterns formed over a front side of the substrate, the diagonal patterns extending in an oblique direction oblique to an X axis and a Y axis of an XY rectangular coordinate system; and
   a phase grating formed over a backside of the substrate, the phase grating having a linear shape extending along the oblique direction to provide a diagonal dipole illumination system.

2. The mask of claim 1, wherein the diagonal patterns correspond to a layout of active regions in a $6F^2$ cell arrangement.

3. The mask of claim 1, wherein the phase grating includes first and second phase regions alternately arranged over the backside of the substrate with a phase difference of 180° therebetween, wherein the first and second phase regions induce a phase interference that blocks a zero-order light of an exposure light incident to the substrate and allows a primary light to be incident to the mask patterns.

4. The mask of claim 3, wherein the first phase region includes a trench having a depth providing the phase difference of 180° to a surface of the backside of the substrate, and the second phase region is a surface region of the backside of the substrate which is delimited by the trench.

5. The mask of claim 3, wherein a grating pitch measured in a direction perpendicular to the oblique direction and equal to a combined width of one of the first phase regions and an adjoining one of the second phase regions is approximately two times a pattern pitch measured in a direction perpendicular to the oblique direction and equal to a combined width of one of the mask patterns and an adjoining space between adjacent mask patterns.

6. The mask of claim 3, wherein the phase grating is arranged in a region broadened by 800 to 1000 μm relative to an outside of a region in which the mask patterns are arranged.

7. A mask, comprising:
   a substrate;
   a first region having diagonal patterns as first mask patterns formed over a front side of the substrate, the diagonal patterns extending in an oblique direction oblique to an X axis and a Y axis of an XY rectangular coordinate system;
   a second region having second mask patterns extending in an axial direction of the XY rectangular coordinate system; and
   a phase grating selectively formed over a backside region of the substrate, wherein the phase grating corresponds to the first region and has a linear shape extending in the oblique direction, and wherein the phase grating is arranged in a region broadened by 800 to 1000 μm relative to an outside of a region in which the first mask patterns are arranged.

8. The mask of claim 7, wherein the diagonal patterns correspond to a layout of active regions in a $6F^2$ cell arrangement.

9. The mask of claim 8, wherein the phase grating includes first and second phase regions alternately arranged over the backside of the substrate with a phase difference of 180° therebetween, wherein the first and second phase regions induce a phase interference that blocks a zero-order light of an exposure light incident to the substrate and allows a primary light to be incident to the mask patterns.

10. The mask of claim 9, wherein the first phase region includes a trench having a depth providing the phase difference of 180° to a surface of the backside of the substrate, and the second phase region is a surface region of the backside of the substrate which is delimited by the trench.

11. The mask of claim 9, wherein a grating pitch measured in a direction perpendicular to the oblique direction and equal to a combined width of one of the first phase regions and an adjoining one of the second phase region is approximately two times a pattern pitch measured in a direction perpendicular to the oblique direction and equal to a combined width of one of the first mask patterns and an adjoining space between adjacent first mask patterns.

12. A method for manufacturing a mask, comprising:
    forming diagonal patterns as mask patterns over a front side of a substrate, the diagonal patterns extending in an oblique direction oblique to an X axis and a Y axis of an XY rectangular coordinate system;
    forming an Anti Reflective Coating (ARC) over the backside of the substrate;
    coating a photoresist layer over the ARC;
    making a mother mask having a pattern layout of a phase grating having a linear shape extending along the oblique direction;
    selectively exposing and developing some of the photoresist layer using the mother mask to form a photoresist pattern; and
    forming trenches having a depth providing a phase difference of 180° to a surface of the backside of the substrate by performing a selective etch on the backside of the substrate exposed by the photoresist pattern.

13. The method of claim 12, wherein the trenches are formed to have a pitch that is approximately two times a pattern pitch including a width of each mask pattern and a width of a spacing of adjacent mask patterns.

14. The method of claim 12, wherein the diagonal patterns correspond to a layout of active regions in a $6F^2$ cell arrangement.

* * * * *